(12) United States Patent
Shimane et al.

(10) Patent No.: US 9,082,803 B2
(45) Date of Patent: Jul. 14, 2015

(54) SUBSTRATE HOLDING APPARATUS, MASK ALIGNMENT METHOD, AND VACUUM PROCESSING APPARATUS USING LONG TAPER PINS AND SHORT TAPER PINS FOR ALIGNMENT

(75) Inventors: Yoshimitu Shimane, Hachioji (JP); Nobuo Yamaguchi, Tama (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 826 days.

(21) Appl. No.: 12/850,706

(22) Filed: Aug. 5, 2010

(65) Prior Publication Data
US 2011/0051115 A1 Mar. 3, 2011

(30) Foreign Application Priority Data

Aug. 25, 2009 (JP) .................................. 2009-193748

(51) Int. Cl.
*H01L 21/68* (2006.01)
*C23C 14/04* (2006.01)
*H01J 37/34* (2006.01)

(52) U.S. Cl.
CPC ............ *H01L 21/682* (2013.01); *C23C 14/042* (2013.01); *H01J 37/3405* (2013.01); *H01J 37/3447* (2013.01); *H01J 37/3485* (2013.01)

(58) Field of Classification Search
CPC ..................... C23C 14/042; H01L 21/68721
USPC ..................................................... 355/72–76
See application file for complete search history.

(56) References Cited

U.S. PATENT DOCUMENTS

| 5,860,640 | A   | * | 1/1999 | Marohl et al. ............ 269/289 R |
| 6,168,668 | B1  | * | 1/2001 | Yudovsky ...................... 118/715 |
| 6,589,352 | B1  |   | 7/2003 | Yudovsky et al. |
| 7,226,283 | B2  | * | 6/2007 | Babin ........................... 425/564 |
| 2004/0003780 | A1 |   | 1/2004 | Yudovsky et al. |
| 2008/0072823 | A1 |   | 3/2008 | Yudovsky et al. |

FOREIGN PATENT DOCUMENTS

JP      2001-274104 A    10/2001

* cited by examiner

*Primary Examiner* — Chia-How Michael Liu
(74) *Attorney, Agent, or Firm* — Fitzpatrick, Cella, Harper & Scinto (57) ABSTRACT

A mask alignment method for a substrate holding apparatus. A first engaging portion is formed in one of a substrate holder and a mask and has two protruding portions. A second engaging portion is formed in the other one of the substrate holder and the mask and has at least one protruding portion. First groove portions formed in the other one of the substrate holder and the mask engage with the protruding portions of the first engaging portion. A second groove portion formed in the other one of the substrate holder and the mask engages with the protruding portion of the second engaging portion. The mask alignment method includes the steps of (a) engaging the protruding portions of the first engaging portion with the first groove portions to align the mask with respect to the substrate holder in a first direction, and (b) engaging, after the step of engaging the protruding portions of the first engaging portion with the first groove portions, the protruding portion of the second engaging portion with the second groove portion, to align the mask with respect to the substrate holder in a direction perpendicular to the first direction.

14 Claims, 10 Drawing Sheets

SUBSTRATE HOLDING APPARATUS, MASK ALIGNMENT METHOD, AND VACUUM PROCESSING APPARATUS USING LONG TAPER PINS AND SHORT TAPER PINS FOR ALIGNMENT

CROSS-REFERENCE TO RELATED APPLICATION

This application claims the benefit of priority from Japanese Patent Application No. 2009-193748, filed Aug. 25, 2009, the entire contents of which are incorporated herein by reference.

BACKGROUND OF THE INVENTION

1. Field of the Invention

The present invention relates to a substrate holding apparatus, a mask alignment method, and a vacuum processing system. In particular, the present invention relates to a substrate holding apparatus and a mask alignment method for positioning a mask with respect to a substrate with high accuracy and excellent reproducibility, while reducing the occurrence of particles, and also relates to a vacuum processing apparatus comprising the substrate holding apparatus.

2. Description of the Related Art

In film deposition apparatuses such as sputtering apparatus and chemical vapor deposition (CVD) apparatuses, a film deposition process is performed with a substrate held on a substrate holder. In this process, it is often difficult to control film qualities, such as film thickness, since an outer circumferential edge (substrate outer edge) of the substrate is chamfered. In particular, in a case when a deposition material, which is prone to exfoliating, is deposited, the deposited material adhering to the outer edge of the substrate may exfoliate to produce particles.

To avoid deposition on the substrate outer edge, a deposition process is performed with the target side of the substrate outer edge covered with a ring-shaped mask, in some cases. (See Japanese Patent Application Publication No. 2001-274104.) Although the mask can prevent deposition on the substrate outer edge, an effective film area may be reduced in a case when the mask is misaligned with respect to the substrate. In other words, a region on the substrate in which deposition is normally performed may vary, and this variation may reduce the number of producible chips. Accordingly, in the case when the mask is used, it is desirable to provide a positioning mechanism for controlling the position of the mask with respect to the substrate with high reproducibility.

As a configuration example of a mechanism for positioning between the substrate (substrate stage) and the mask, a mask positioning mechanism (centering mechanism) will be described, which is shown in FIGS. 7 to 10 of Japanese Patent Application Publication No. 2001-274104. The mechanism described in Japanese Patent Application Publication No. 2001-274104 is provided in a structure in which the substrate stage and the mask are separated in the process of setting the substrate, and has a centering function by engaging conical taper pins formed on the mask side with conical grooves formed on the substrate stage side.

In the technique described in Japanese Patent Application Publication No. 20010274104, however, the gaps between the taper pins and the holes need to be large, in order to prevent galling between the conical taper pins and the holes. Accordingly, the above-described mechanism has a problem of not being necessarily suitable as a mechanism for performing positioning with high accuracy.

On the other hand, in addition to effective film area improvement and mask positioning accuracy improvement, further particle reduction and maintenance cost reduction are desired, from the viewpoints of electronic device density growth and productivity improvement.

SUMMARY OF THE INVENTION

Objects of the present invention are to solve the above-described problems and to provide a mask alignment mechanism, a mask alignment method, and a vacuum processing apparatus that reduce the occurrence of particles, and that can position a mask with high accuracy.

Another object of the present invention is to provide a mask alignment mechanism, a mask alignment method, and a vacuum processing apparatus that contribute to fabrication and maintenance cost reduction by aligning a mask with the use of a relatively simple structure.

According to one aspect, the present invention provides a mask alignment method for a substrate holding apparatus including a substrate holder capable of holding a substrate, a mask to be located on the substrate holder with the substrate interposed therebetween, a first engaging portion which is formed in any one of the substrate holder and the mask and which has two protruding portions, a second engaging portion which is formed in any one of the substrate holder and the mask and which has at least one protruding portion, first groove portions formed in the other one of the substrate holder and the mask to engage with the protruding portions of the first engaging portion, and a second groove portion formed in the other one of the substrate holder and the mask to engage with the protruding portion of the second engaging portion, the mask alignment method comprising the steps of engaging the protruding portions of the first engaging portion with the first groove portions to align the mask with respect to the substrate holder in a first direction, and engaging the protruding portion of the second engaging portion with the second groove portion to align the mask with respect to the substrate holder in a direction perpendicular to the first direction.

According to another aspect, the present invention provides a substrate holding apparatus comprising a substrate holder capable of holding a substrate, a mask to be located on the substrate holder with the substrate interposed therebetween, a first engaging portion which is formed in any one of the substrate holder and the mask and which has two protruding portions, a second engaging portion which is formed in any one of the substrate holder and the mask and which has at least one protruding portion shorter than the protruding portions of the first engaging portion, first groove portions formed in the other one of the substrate holder and the mask to engage with the protruding portions of the first engaging portion, and a second groove portion formed in the other one of the substrate holder and the mask to engage with the protruding portion of the second engaging portion, wherein, in a state in which the mask is located on the substrate holder, the protruding portion of the second engaging portion is located on a line perpendicular to a straight line passing through the two protruding portions of the first engaging portion.

According to yet another aspect, the present invention provides a substrate holding apparatus comprising a substrate holder capable of holding a substrate, a mask to be located on the substrate holder with the substrate interposed therebetween, a first engaging portion which is formed in any one of the substrate holder and the mask and which has two protruding portions, a second engaging portion which is formed in any one of the substrate holder and the mask and which has at least one protruding portion shorter than the protruding portion of the first engaging portion, first groove portions formed in the other one of the substrate holder and the mask to engage with the protruding portion of the first engaging portion, and a second groove portion formed in the other one of the substrate holder and the mask to engage with the protruding portion of the second engaging portion, characterized in that the two protruding portions of the first engaging portion have first tapered surfaces formed at one end thereof, and the other ends of the two protruding portions of the first engaging portion are connected to any one of the substrate holder and the mask, the protruding portion of the second engaging portion has a second tapered surface formed at one end thereof, and the other end of the protruding portion of the second engaging portion is connected to any one of the substrate holder and the mask, and a region in which the two first tapered surfaces of the first engaging portion are formed and a region in which the second tapered surface of the second engaging portion is formed do not overlap each other in a direction in which the substrate holder and the mask are engaged with each other.

The use of a mask alignment mechanism, a mask alignment method, and a vacuum processing apparatus according to the present invention enables the relative position between a substrate and a mask to be determined with high accuracy and reproducibility. Moreover, the occurrence of particles can be reduced. Further, since a simple structure without a slide drive mechanism having a high-accuracy sliding portion is employed, fabrication and maintenance costs can be greatly reduced.

DETAILED DESCRIPTION OF THE INVENTION

One embodiment of the present invention will now be described, with reference to the drawings. It should be noted that the members, layout, and the like, mentioned below, are examples for implementing the invention, are not intended to limit the present invention, and, of course, can be variously modified without departing from the spirit of the present invention.

In the specification of the present application, a description will be made by taking a sputter deposition apparatus 1 as an example of a vacuum processing apparatus, but the present invention is not limited to this. A mask alignment mechanism according to the embodiment of the present invention can also be favorably applied to other apparatus, e.g., a PVD apparatus, a CVD apparatus, or the like. Moreover, the mask alignment mechanism according to the embodiment of the present invention can also be favorably applied to a processing apparatus other than a deposition apparatus, i.e., a processing apparatus, such as a dry etching apparatus or an ashing apparatus.

Figure 1:
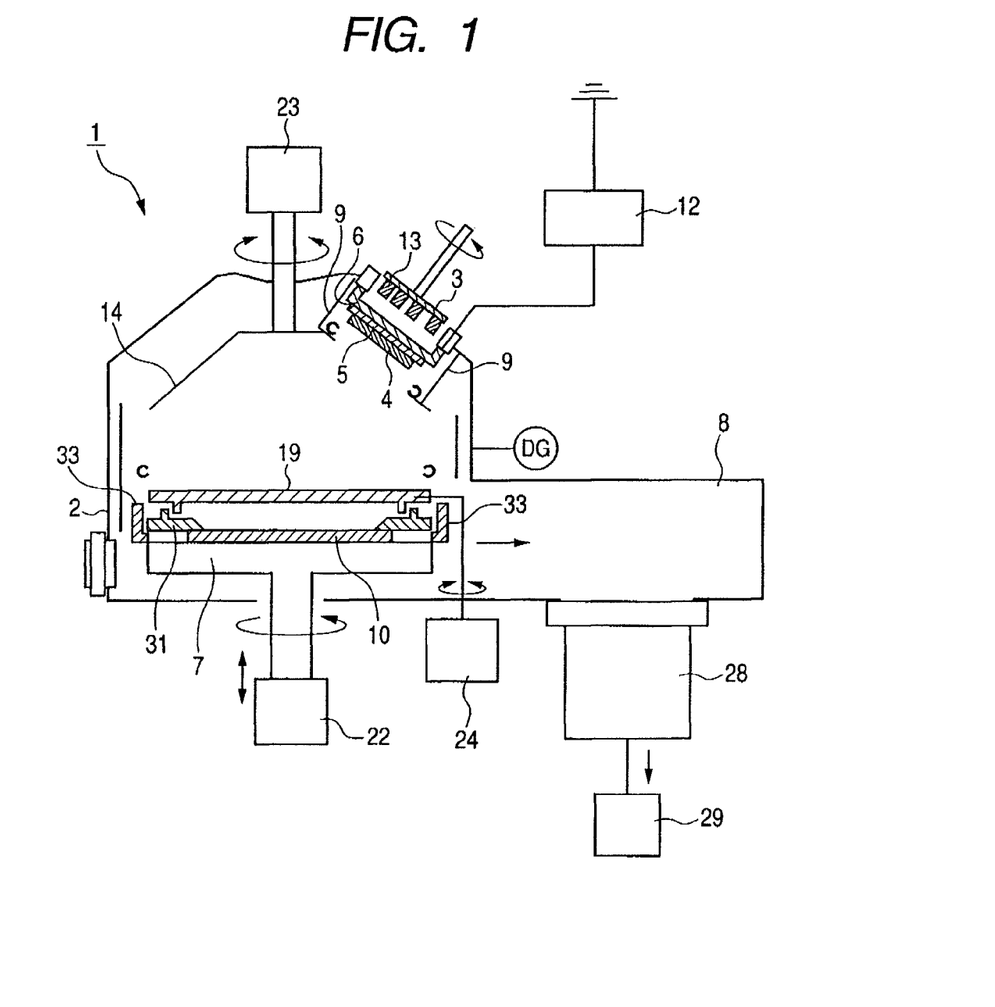
FIG. 1 is a schematic cross-sectional view of a sputter deposition apparatus according to one embodiment of the present invention.
Figure 2:
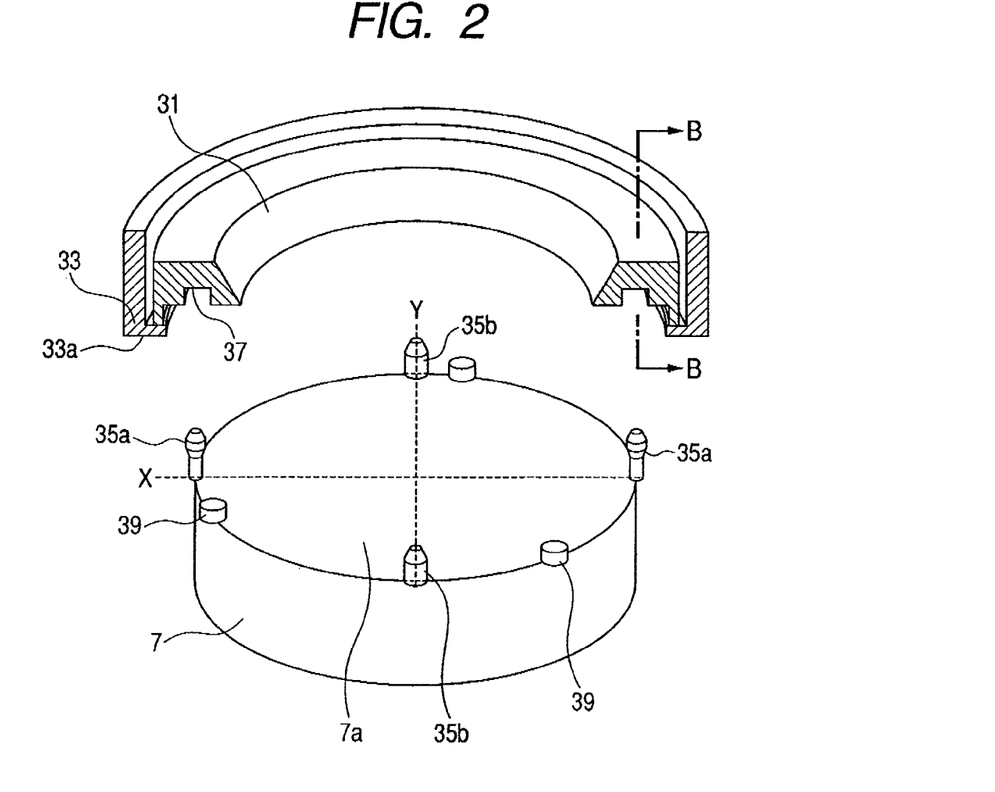
FIG. 2 is a schematic view (transfer position) of a mask alignment mechanism according to one embodiment of the present invention.
Figure 3:
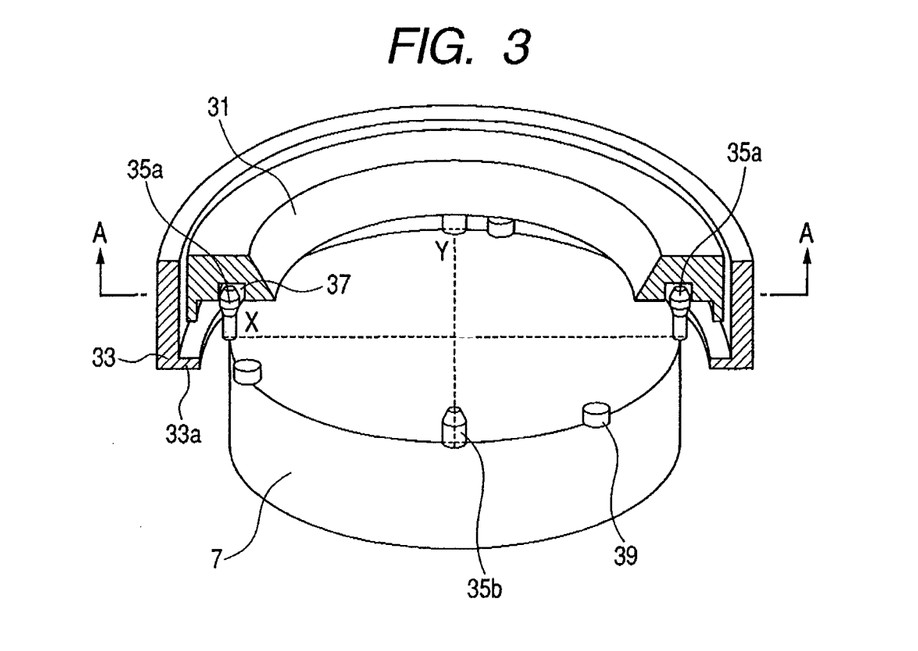
FIG. 3 is a schematic view (deposition position) of the mask alignment mechanism according to one embodiment of the present invention.
Figure 4A:
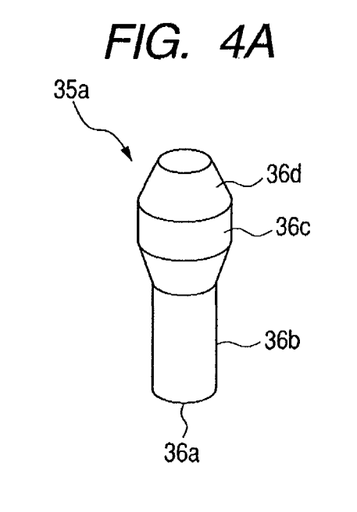
FIG. 4A is a perspective view of a taper pin according to one embodiment of the present invention.
Figure 4B:
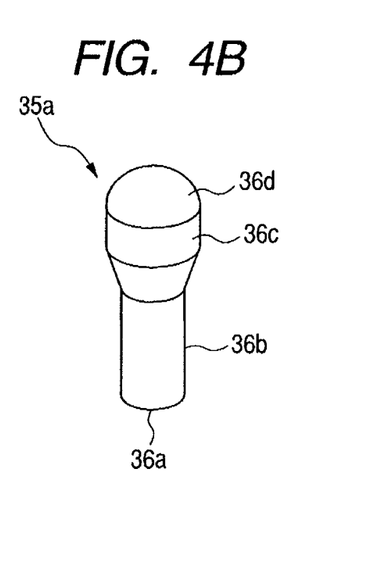
FIG. 4B is a perspective view of a taper pin according to one embodiment of the present invention.
Figure 5:
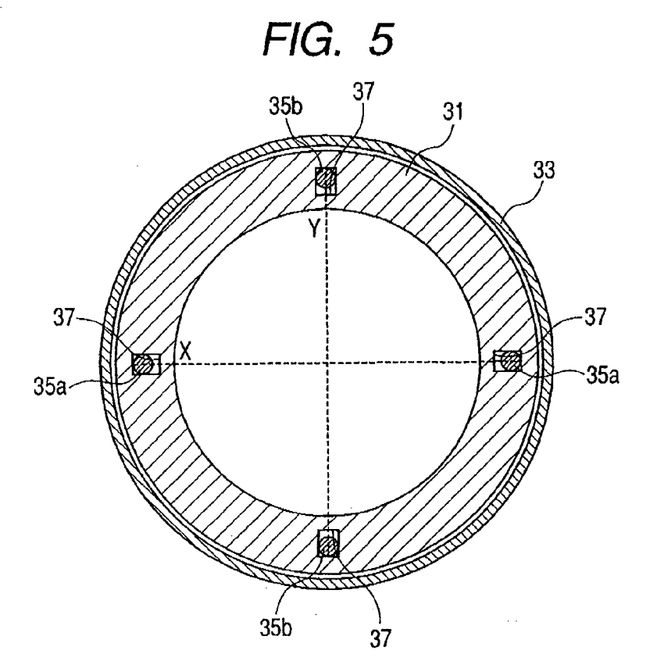
FIG. 5 is a cross-sectional view of grooves according to one embodiment of the present invention, and is a cross-sectional view taken along line A-A of FIG. 3.
Figure 6A:
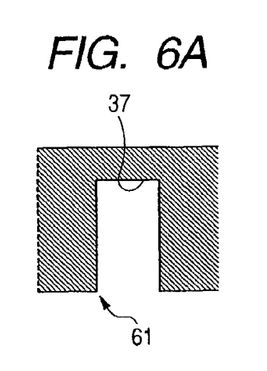
FIG. 6A is a cross-sectional view of a groove according to one embodiment of the present invention, and is a cross-sectional view along line B-B of FIG. 2.
Figure 6B:
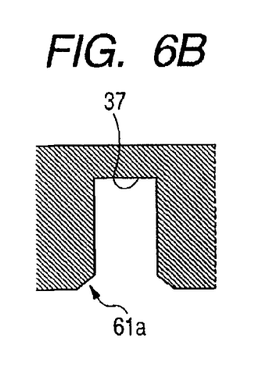
FIG. 6B is a cross-sectional view of a groove according to one embodiment of the present invention, and is a cross-sectional view along line B-B of FIG. 2.
Figure 6C:
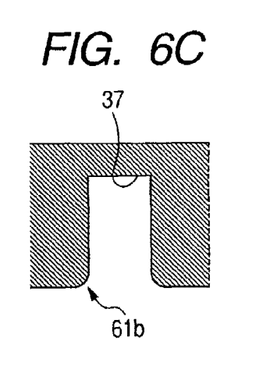
FIG. 6C is a cross-sectional view of a groove according to one embodiment of the present invention, and is a cross-sectional view along line B-B of FIG. 2.
Figure 7:
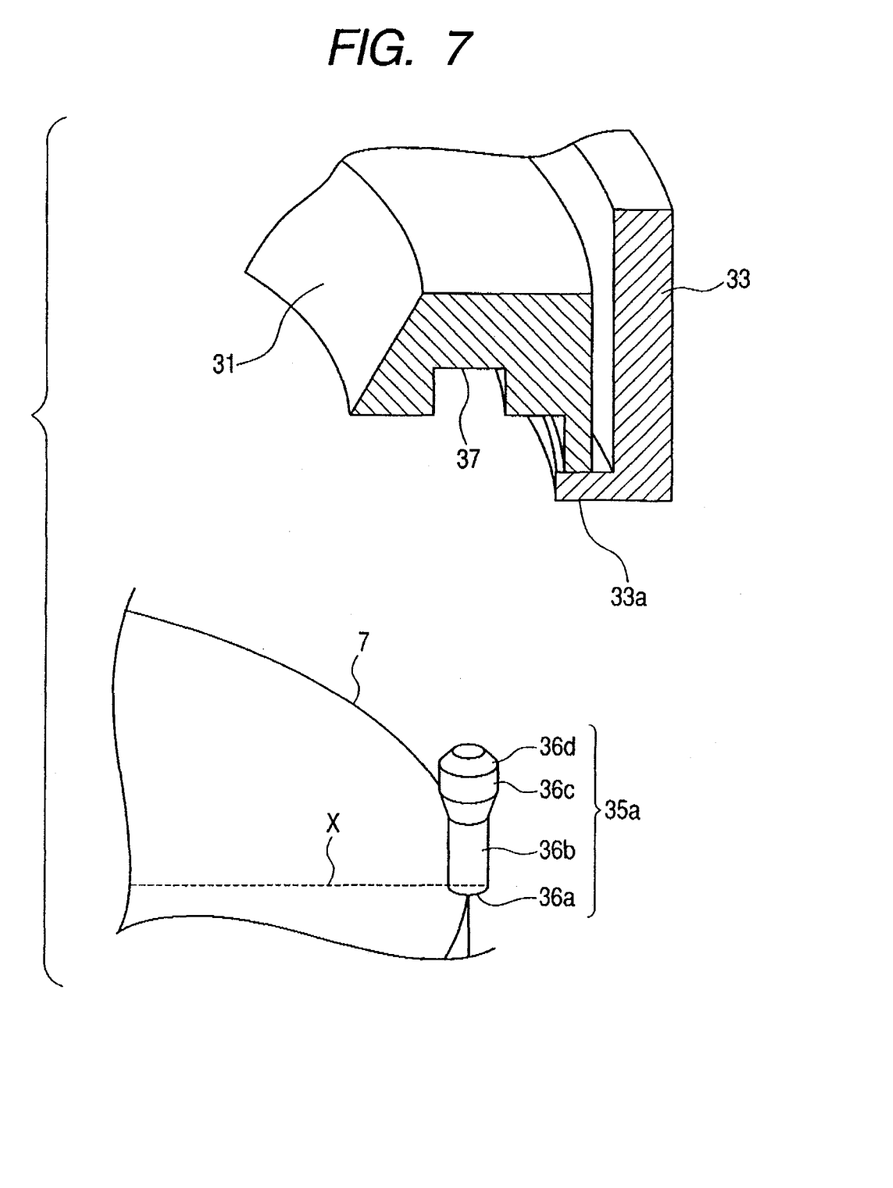
FIG. 7 is an enlarged view of a portion serving as the mask alignment mechanism according to one embodiment of the present invention.

Each of FIGS. 1 to 13 is a drawing about a deposition apparatus or a mask alignment method according to an embodiment of the present invention. FIG. 1 is a schematic cross-sectional view of a sputter deposition apparatus. FIG. 2 is a schematic view (transfer position) of the mask alignment mechanism. FIG. 3 is a schematic view (deposition position) of the mask alignment mechanism. Each of FIGS. 4A and 4B is a perspective view of a taper pin. FIG. 5 is a cross-sectional view along line A-A which shows grooves. Each of FIGS. 6A to 6C is a cross-sectional view along line B-B which shows a groove. FIG. 7 is an enlarged view of a portion serving as the mask alignment mechanism. FIGS. 8 to 13 are views for explaining a mask alignment process. Incidentally, some portions are omitted so as not to make the drawings complicated.

FIG. 1 is a schematic cross-sectional view of a sputter deposition apparatus 1 according to the embodiment of the present invention. The sputter deposition apparatus 1 includes a vacuum chamber 2 capable of being evacuated, an exhaust chamber 8 provided adjacent to the vacuum chamber 2 with an exhaust portion interposed therebetween, and an exhaust apparatus for evacuating the vacuum chamber 2 through the exhaust chamber 8. The exhaust apparatus includes a turbo-molecular pump 28 and a dry pump 29. Incidentally, the exhaust apparatus is provided under the exhaust chamber 8 to reduce the footprint (occupied area) of the entire apparatus as much as possible.

In the vacuum chamber 2, a target holder 6 is provided to hold a target 4 with a back plate 5 interposed therebetween. In the vicinity of the target holder 6, a target shutter 14 is placed to cover the target holder 6. The target shutter 14 has the structure of a rotary shutter. The target shutter 14 functions as a blocking member for providing a closed state (blocked state) in which a substrate holder 7 and the target holder 6 are blocked from each other or an open state (retracted state) in which the substrate holder 7 and the target holder 6 are opened to each other.

For the target shutter 14, a target shutter drive mechanism 23 is provided to open and to close the target shutter 14. In a space between the target holder 6 and the target shutter 14, a chimney 9, as a tubular shield, is attached to the periphery of the target holder 6 to surround the target holder 6. A magnetron discharge space on a sputtered surface side of the target 4 attached to the target holder 6 is surrounded by the chimney 9. In a shutter open state, the magnetron discharge space faces an opening portion of the target shutter 14 to be opened to the substrate holder 7 side.

Behind the target 4 from the sputtered surface, magnets 13 are disposed to realize magnetron sputtering. The magnets 13 are held by a magnet holder 3 and can be rotated by a magnet holder rotation mechanism (not shown). To make the erosion of the target 4 uniform, the magnets 13 are rotationally driven during discharge.

The target 4 is placed at a position (offset position) located obliquely above a substrate 10 held by the substrate holder 7. In other words, the central point of the sputtered surface of the target 4 is at a position located a predetermined dimension away from the normal to the substrate 10 at the central portion thereof. To the target holder 6, a power supply 12 is connected to apply power for sputtering discharge thereto. When voltage is applied from the power supply 12 to the target holder 6, discharge is started, and sputtered particles are deposition on the substrate 10.

Incidentally, though in this embodiment, the target 4 is located obliquely above the substrate 10 in the sputter deposition apparatus 1 shown in FIG. 1, the target 4 may, for example, be located over the substrate 10. Moreover, though the sputter deposition apparatus 1 includes a DC power supply, the present invention is not limited to this. For example, the sputter deposition apparatus 1 may include an RF power supply. In a case when an RF power supply is used, a matching box needs to be placed between the power supply 12 and the target holder 6. The back plate 5 placed between the target 4 and the target holder 6 is made of a metal such as Cu, and holds the target 4.

Moreover, the vacuum chamber 2 contains the substrate holder 7 on which the substrate 10 is to be mounted, a substrate shutter 19 provided between the substrate holder 7 and the target holder 6, and a substrate shutter drive mechanism 24 for opening and closing the substrate shutter 19. The substrate shutter 19 is located near the substrate holder 7, and functions as a blocking member for providing a closed state in which the substrate holder 7 and the target holder 6 are blocked from each other, or an open state, in which the substrate holder 7 and the target holder 6 are not blocked from each other.

A mask 31 in the shape of a ring is provided to cover the upper side of the outer edge of the substrate 10 held on a surface (substrate-holding surface 7a) of the substrate holder 7. Moreover, around the mask 31, a shield 33, approximately in the shape of a cylinder, is provided to surround the side surface of the mask 31. The mask 31 can prevent or reduce the adhesion of the sputtered particles to places other than a deposition surface of the substrate 10 held on the substrate holder 7. The places other than the deposition surface include the surface of the substrate holder 7 covered with the mask 31, as well as an outer edge portion, the side surface, and the back surface of the substrate 10. Moreover, the shield 33 reduces the adhesion of sputtered particles to the substrate holder 7 and the mask 31, and supports the mask 31, as described later.

For the substrate holder 7, a substrate holder drive mechanism 22 is provided to rotate and to vertically move the substrate holder 7. The mask 31 needs to be accurately positioned with respect to the substrate holder 7, and the substrate 10 held on the substrate holder 7. In this embodiment, a mask positioning mechanism is configured so that a position where the mask 31 is to be disposed may be accurately reproduced based on members such as the substrate holder 7 and the mask 31.

Hereafter, the mask positioning mechanism according to this embodiment will be described with reference to FIGS. 2 to 13. FIG. 2 is a schematic view (partial sectional view) of the mask alignment mechanism in a transfer position, and shows the positional relationship among the substrate holder 7, the mask 31, and the shield 33 at a time when the substrate 10 is disposed on a substrate-holding surface 7a of the substrate holder 7 by a transfer mechanism. At this time, the mask 31 for preventing deposition on places other than the deposition surface of the substrate 10 is locked on a bent portion 33a in a lower end portion of the shield 33, and is held at such a position that the substrate 10 can be transferred onto the substrate holder 7.

Incidentally, the transfer mechanism for the substrate 10 may be, for example, a substrate transfer robot. Moreover, though FIGS. 2 to 13 show a state in which the substrate 10 is held at a predetermined position on the substrate-holding surface 7a of the substrate holder 7, the substrate 10 is not shown, to avoid complication of the drawings.

On the substrate holder 7, taper pins 35 (taper pins 35a and 35b are also referred to as "taper pins 35") (positioning pins) as engaging portions (protruding portions) are attached to four positions ninety degrees apart on the outer edge side of the substrate-holding surface 7a. The taper pins 35 include two types having different lengths: the long taper pins 35a as a first engaging portion and the short taper pins 35b as a second engaging portion. Accordingly, in a case when the long taper pins 35a and the short taper pins 35b are provided on the substrate-holding surface 7a, the long taper pins 35a are higher than the short taper pins 35b. In this embodiment, for example, as shown in FIG. 2, the taper pins 35 are selected such that a pair of taper pins 35 (35a or 35b) facing (opposite to) each other across a central portion of the substrate-holding surface 7a of the substrate holder 7 have the same height (length).

Grooves 37 are formed as groove portions in respective portions of the mask 31 that face the taper pins 35. The grooves 37 are formed to have approximately rectangular cross sections. The gaps (clearances) between the taper pins 35 and the grooves 37 are adjusted so that the positional relationship between the substrate holder 7 and the mask 31 may be set with high accuracy and reproducibility.

FIG. 3 is a schematic view (partial sectional view) of the mask alignment mechanism in a deposition position, and shows a state in which the substrate holder 7 is raised by being driven by the substrate holder drive mechanism 22 and in which the mask 31 is mounted on pads 39 of the substrate holder 7. At this time, the taper pins 35 are inserted into the grooves 37. The relative position in the in-plane direction (X-Y direction) between the mask 31 and the substrate holder 7 is determined by the fitting of the taper pins 35 into the grooves 37. Since the taper pins 35 include two types, the taper pins 35a and 35b are inserted into the grooves 37 with different timings, in accordance with their differences in length, respectively.

In other words, first, the insertion of the long taper pins 35a into the grooves 37 (first groove portion) determines the position (first direction) of the mask 31 on an X axis connected the two long taper pins 35a, and then the insertion of the short taper pins 35b into the grooves 37 (second groove portion) determines the position (direction perpendicular to the first direction) of the mask 31 on a Y axis connecting the two short taper pins 35b. Moreover, the relative position in the height direction (Z direction) between the mask 31 and the substrate holder 7 is determined by the heights of the pads 39. The heights of the pads 39 are set such that the distance between the mask 31 and the substrate 10 becomes a predetermined dimension. The use of the pads 39 can make dust formation less likely, because the mask 31 and the substrate 10 do not come in contact with each other.

Referring now to FIGS. 4 to 6, the taper pins 35 and the grooves 37 will be further described. FIG. 4A shows a perspective view of the long taper pin 35a. The long taper pin 35a is connected to the substrate holder 7 on the side of a base 36a thereof, and has a tapered surface 36d formed on a tip side thereof. In a case when the centers of the mask 31 and the substrate holder 7 do not coincide with each other, contacting the tapered surface 36d with a rim portion (edge portion) provides the ability to adjust the position of the mask 31 along the tapered surface 36d. This will be described later.

Moreover, a straight portion 36c exists on the substrate holder 7 side (the base 36a side) of the tapered surface 36d, and a narrow portion 36b machined to have a small diameter is formed between the straight portion 36c and the base 36a. The material of the long taper pins 35a may be metal, such as stainless steel, or an insulating ceramic. In a case when the taper pins 35 and the pads 39 are made of an insulating material (insulating ceramic or the like), the mask 31 can be made so as to electrically float. Further, to reduce sliding contact resistance to the grooves 37, the surfaces of the taper pins 35 are preferably coated with TiN, DLC, or the like. Incidentally, the tapered surfaces 36d of the long taper pins 35a may be curved surfaces, as shown in FIG. 4B.

Figure 11:
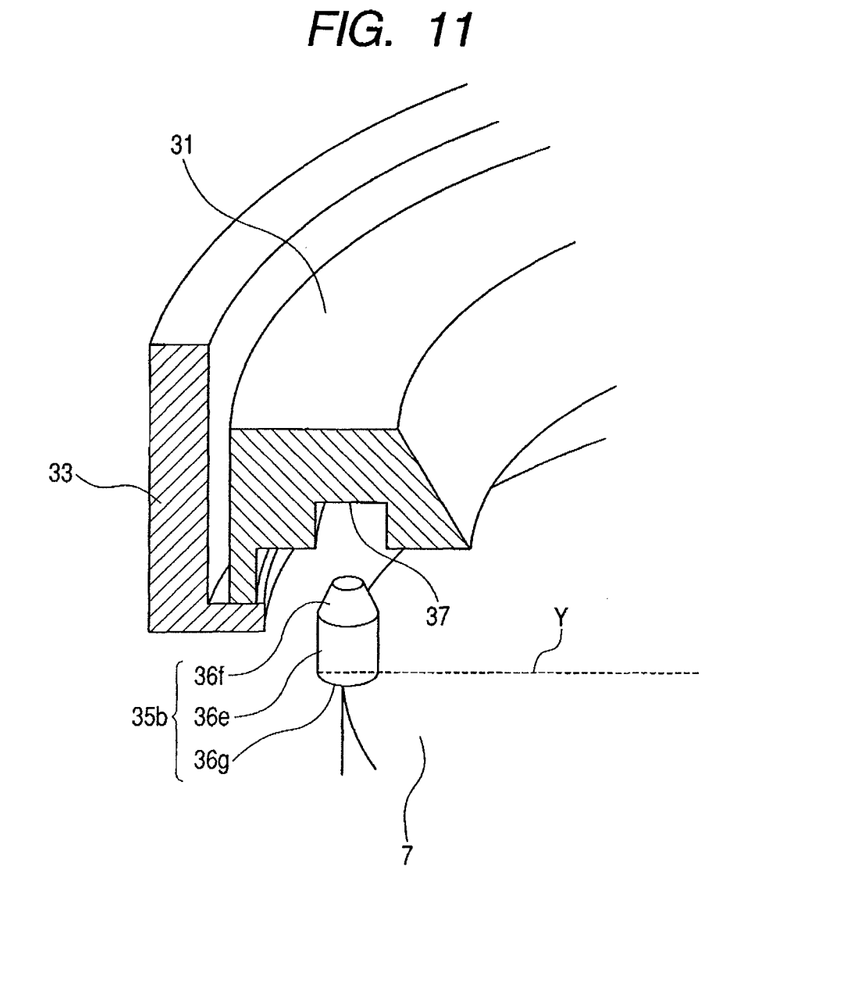
FIG. 11 is a view for explaining the mask alignment process according to one embodiment of the present invention.

Each of the short taper pins 35b is, though not shown in an enlarged manner, as shown in FIG. 11, connected to the substrate holder 7 on the side of a base 36g thereof, has a tapered surface 36f formed on a tip side thereof, and has a straight portion 36e formed between the base 36g side and the tapered surface 36f. In this embodiment, the short taper pin 35b is in a shape having no narrow portion. However, the short taper pin 35b may have a narrow portion formed on the base 36g side of the straight portion 36e. The material and surface treatment of the short taper pins 35b may be the same as those of the long taper pins 35a.

FIG. 5 is a cross-sectional view (cross-sectional view along line A-A of FIG. 3) of the mask 31 having the taper pins 35 inserted therein as viewed from above the substrate-holding surface 7a of the substrate holder 7, and shows a cross-sectional layout of the grooves 37 and the taper pins 35. The grooves 37 have approximately rectangular cross-sectional shapes that are long in the directions toward the center of the substrate 10 held by the substrate holder 7, i.e., in the direction of the center of the mask 31. Such shapes enable the taper pins 35 to be fitted into the grooves 37, even when the mask 31 is thermally expanded. Moreover, since thermal expansion is slight in the directions of the widths of the grooves 37, the long taper pins 35a and the short taper pins 35b can accurately determine the position of the mask 31 on the X and Y axes, respectively.

Each of FIGS. 6A to 6C shows a cross section (cross-sectional view along line B-B of FIG. 2) of one of the grooves 37 in the Z direction. Edge portions 61 (FIG. 6A) of the groove 37 may be chamfered into cut-off shapes 61a (FIG. 6B) or round shapes 61b (FIG. 6C). Incidentally, the inclination angles and surface accuracies (surface treatment) of the tapered surfaces 36d and 36f and the surface accuracies (surface treatment) and edge portion treatment, such as chamfering, of the grooves 37 are selected such that the mask 31 can move without being impeded by frictional forces due to contact with the taper pins 35 (35a and 35b).

Next, the process of aligning the mask 31 will be described in detail with reference to FIGS. 7 to 13.

First, FIGS. 7 to 10 show a situation in which the long taper pins 35a are inserted into the grooves 37 as the substrate holder 7 is raised. FIG. 7 shows a state in which the substrate holder 7 is at the transfer position, i.e., at a lowered position. At this time, the substrate 10 is located at a predetermined position above the substrate holder 7 (substrate-holding surface 7a) by the transfer mechanism (not shown).

Figure 8:
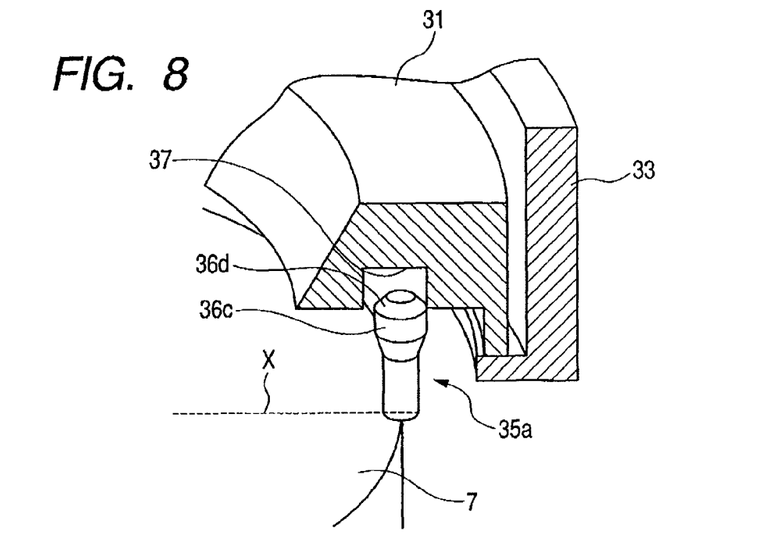
FIG. 8 is a view for explaining a mask alignment process according to one embodiment of the present invention.

FIG. 8 shows the states of one of the taper pins 35a and the mask 31 during the raising of the substrate holder 7. When the substrate holder 7 is raised, the tapered surfaces 36d of the long taper pins 35a come in contact with the edge portions of the grooves 37. Since the substrate holder 7 is raised while the tapered surfaces 36d are in sliding contact with the edge portions of the grooves 37, the centering function of locating the mask 31 on the X axis can be exerted.

Figure 9:
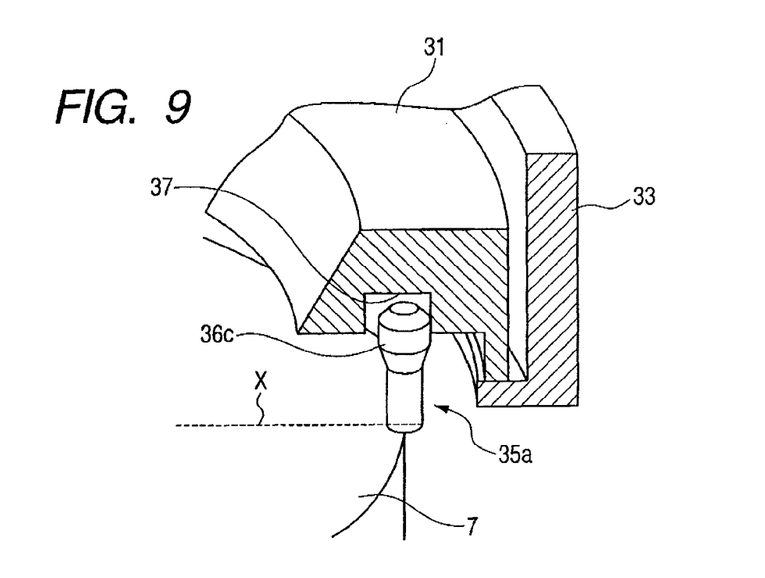
FIG. 9 is a view for explaining the mask alignment process according to one embodiment of the present invention.
Figure 10:
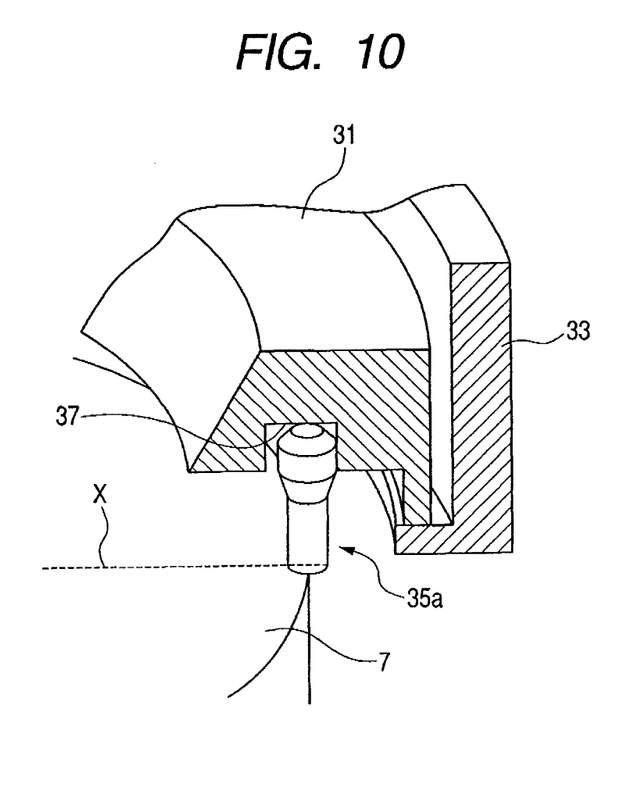
FIG. 10 is a view for explaining the mask alignment process according to one embodiment of the present invention.

As shown in FIGS. 9 and 10, when the substrate holder 7 is further raised, the long taper pins 35a come in contact with the grooves 37 at the straight portions 36c. Accordingly, the long taper pins 35a do not exert drag forces on the mask 31. In this state, the two grooves 37 located in the mask 31 to face each other across a central portion of the mask 31 are located on the X axis.

Figure 12:
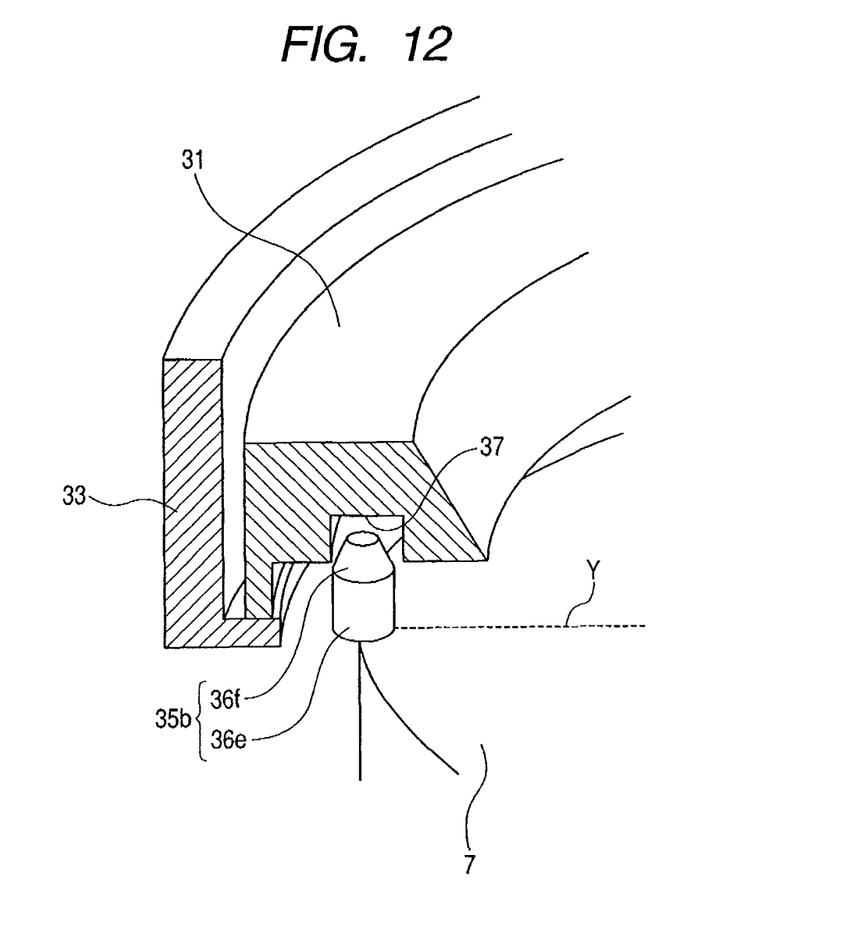
FIG. 12 is a view for explaining the mask alignment process according to one embodiment of the present invention.
Figure 13:
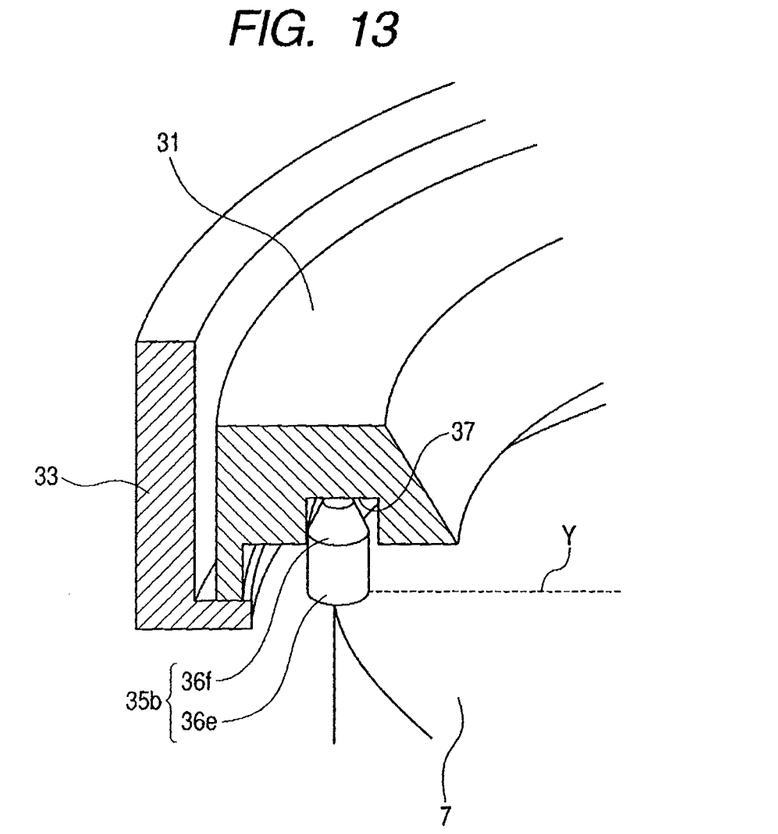
FIG. 13 is a view for explaining the mask alignment process according to one embodiment of the present invention.

FIGS. 11 to 13 show a situation in which the substrate holder 7 is raised and in which the short taper pins 35b are inserted into the grooves 37. FIG. 11 shows the state of one of the short taper pins 35b at the time when the mask 31 is at the position shown in FIG. 8. At this time, the short taper pins 35b have not reached positions where the short taper pins 35b come in contact with the grooves 37. Accordingly, the short taper pins 35b do not exert drag forces on the mask 31.

Moreover, even in a case when the mask 31 is inclined with respect to the substrate-holding surface 7a, in the uniaxial centering process (see FIG. 8) only along the X axis, the narrow portions 36b of the long taper pins 35a can reduce a change in friction force during centering to a minimum. Accordingly, the gap (clearance) between the long taper pins 35a and the grooves 37 can be minimized.

FIG. 12 shows the state of one of the short taper pins 35b at the time when the mask 31 is at the position shown in FIG. 9.

The short taper pins 35b can exert the centering function of locating the mask 31 on the Y axis, with the tapered surfaces 36f on the short taper pins 35b being in contact with the edge portions of the grooves 37, by allowing the edge portions of the grooves 37 to slide on the tapered surfaces 36f as the substrate holder 7 is raised. At this time, since the guiding of the mask 31 to the X axis has been completed by the long taper pins 35a (see FIG. 9), the mask 31 is subject to drag forces only in one direction. Thus, a complex overlap of drag forces does not occur. Incidentally, the number of the short taper pins 35b does not need to be one pair. Even one short taper pin 35b makes it possible to exert effects of the present invention.

FIGS. 10 and 13 show the states of the mask 31 and the taper pins 35a and 35b in a case when the substrate holder 7 is at a position (deposition position) at which the substrate holder 7 is completely raised. At this time, since the short taper pins 35b are in contact with the grooves 37 at the straight portions 36e, the mask 31 is located on the Y axis. Moreover, since the long taper pins 35a continue to be in the state shown in FIG. 9, i.e., are also in contact with the grooves 37 at the straight portions 36c, the mask 31 is located on the X axis. Accordingly, the positional relationship between the mask 31 and the substrate holder 7 is determined with high accuracy.

Here, the depths of the grooves 37 are set to be large enough to avoid contact with the tops of the taper pins 35.

The mask alignment mechanism according to the embodiment of the present invention includes the taper pins 35a and 35b having different lengths as major components, and taper pins 35 (35a or 35b) having the same lengths are located at positions facing each other across the substrate 10. Accordingly, a process in which the centering of the mask 31 is performed in a plane containing the line (X or Y axis) connecting this pair of taper pins 35 is performed twice in accordance with the number of lengths of the taper pins 35. During centering, an increase in frictional force tends to occur at the earliest stage of centering in which the taper pins 35 come in contact with the grooves 37. When this increase in frictional force occurs at plural positions at the same time, drag forces exerted on the mask 31 increase or become available. This causes vibrations of the mask 31.

If the heights of the tapered surfaces 36d and 36f are equal to each other, centering in the X direction and that in the Y direction are performed at the same time. In this case, drag forces in the X and Y directions are exerted on the mask 31 at the same time, and a complex stress state occurs. Accordingly, vibrations and galling tend to occur between the mask 31 and the taper pins 35.

On the other hand, in an embodiment of the present invention, a positioning mechanism is configured such that the taper pins 35a and 35b have different lengths (more precisely, the height regions of the tapered surfaces 36d and 36f formed in the taper pins 35a and 35b do not overlap). Accordingly, a centering mechanism is provided in which drag forces in plural directions are not exerted on the mask 31 at the same time. In other words, since the phases (range of movement of the substrate holder) of drag forces exerted on the mask 31 can be shifted, the operation of more accurately positioning the mask 31 can be realized.

In the embodiment of the present invention, the accuracy of the relative position between the mask 31 and the substrate holder 7 can be reduced to ±0.25 mm or less. Moreover, a structure is provided in which, in the process of raising the substrate holder 7 in FIGS. 8 to 13, drag forces exerted on the mask 31 at the same time are limited to one direction. Accordingly, the occurrence of particles due to vibrations of the mask 31 or the taper pins 35 can also be reduced. In the embodiment of the present invention, an increase of particles of 0.16 μm or more in diameter has not been observed. Accordingly, a deposition mechanism according to the present invention enables a deposition process to be performed with a higher yield, and can contribute to productivity improvement and cost reduction.

In this embodiment, the taper pins 35 are formed on the substrate holder 7 side, and the grooves 37 are formed on the mask 31 side. However, if the taper pins 35 are formed on the mask 31 side and the grooves 37 are formed on the substrate holder 7 side, similar effects can be expected. The same is true of a mechanism in which the mask 31 side is moved up and down. Moreover, in the embodiment described as to the present invention, an embodiment has been cited in which the number of the taper pins 35 is set to four. However, a configuration in which the number of the taper pins 35 is three, five, or more may also be employed, as long as the numbers for the long and short taper pins 35a and 35b are at least two and one, respectively.

It should be noted that, although the mask 31 in this embodiment is disposed to cover an outer edge portion of the substrate 10, a configuration may also be employed in which the mask 31 is disposed to cover only a peripheral portion of the substrate holder 7 on which the substrate 10 is located. In particular, in a case of a so-called full-surface deposition, in which a deposition on the deposition surface of the substrate 10 is set to be as large as possible, the mask alignment mechanism according to the present invention is also suitably applied to a case when the diameter of the substrate 10 and the inside diameter of the mask 31 are almost equal, or when the inside diameter of the mask 31 is slightly larger than the diameter of the substrate 10. Moreover, a configuration may also be employed in which the mask 31 is disposed in direct contact with the substrate 10. A configuration in which the mask 31 is brought into direct contact with the substrate 10 can improve the effect of preventing deposition on the substrate outer end and the back surface.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A mask alignment method for a substrate holding apparatus:
   (A) the substrate holding apparatus including:
      (i) a substrate holder capable of holding a substrate;
      (ii) a mask to be located on the substrate holder with the substrate interposed therebetween;
      (iii) a first engaging portion which is formed on any one of the substrate holder and the mask, and which has two protruding portions, wherein the two protruding portions of the first engaging portion are arranged along a first direction;
      (iv) a second engaging portion which is formed on the any one of the substrate holder and the mask, and which has two discrete protruding portions, wherein the two discrete protruding portions of the second engaging portion are arranged along a second direction that is perpendicular to the first direction, the first and second directions being in a same plane;
      (v) first groove portions formed in the other one of the substrate holder and the mask to engage with the two protruding portions of the first engaging portion; and
      (vi) second groove portions formed in the other one of the substrate holder and the mask to engage with the two discrete protruding portions of the second engaging portion,
   (B) the mask alignment method comprising the steps of:
      while moving the mask close to the substrate holder,
      (a) engaging the two protruding portions of the first engaging portion with the first groove portions to align the mask with respect to the substrate holder in the first direction; and
      (b) engaging, after the step of engaging the two protruding portions of the first engaging portion with the first groove portions, the two discrete protruding portions of the second engaging portion with the second groove portions, to align the mask with respect to the substrate holder in the second direction.

2. A substrate holding apparatus comprising:
   a substrate holder capable of holding a substrate;
   a mask to be located on the substrate holder with the substrate interposed therebetween;
   a first engaging portion which is formed on any one of the substrate holder and the mask and which has two protruding portions, wherein the two protruding portions of the first engaging portion are arranged along a first direction;

a second engaging portion which is formed on the any one of the substrate holder and the mask and which has two discrete protruding portions, wherein a length of a part that protrudes from the any one of the substrate holder and the mask, of the two discrete protruding portions of the second engaging portion, is shorter than each of a length of a part that protrudes from the any one of the substrate holder and the mask, of the two protruding portions of the first engaging portion, wherein the two discrete protruding portions of the second engaging portion are arranged along a second direction that is perpendicular to the first direction, the first and second directions being in a same plane;

first groove portions formed in the other one of the substrate holder and the mask to engage with the two protruding portions of the first engaging portion; and second groove portions formed in the other one of the substrate holder and the mask to engage with the two discrete protruding portions of the second engaging portion.

3. The substrate holding apparatus according to claim 2, wherein the two protruding portions of the first engaging portion have first tapered surfaces formed at one ends thereof, and the other ends of the two protruding portions of the first engaging portion are connected to the any one of the substrate holder and the mask, the two discrete protruding portions of the second engaging portion have a second tapered surface formed at one end thereof, and the other ends of the two discrete protruding portions of the second engaging portion are connected to the any one of the substrate holder and the mask, and a region in which the two first tapered surfaces of the first engaging portion are formed and a region in which the second tapered surface of the second engaging portion is formed do not overlap each other in a direction in which the substrate holder and the mask are engaged with each other.

4. The substrate holding apparatus according to claim 2, wherein each of the two protruding portions of the first engaging portion has a narrow portion formed on a side of an end thereof, the end being connected to the any one of the substrate holder and the mask.

5. The substrate holding apparatus according to claim 2, wherein the first groove portions are long openings that are long in respective directions toward a center of the other one of the mask and the substrate holder, and the second groove portions are long openings that are long in respective directions toward a center of the other one of the mask and the substrate holder.

6. The substrate holding apparatus according to claim 2, wherein surfaces of the first engaging portion and the second engaging portion are coated with at least one of TiN and DLC.

7. The substrate holding apparatus according to claim 2, wherein the first engaging portion and the second engaging portion comprise an insulating ceramic.

8. A vacuum processing apparatus comprising:
a processing chamber for performing vacuum processing on a substrate in a vacuum atmosphere,
wherein the processing chamber is provided with the substrate holding apparatus according to claim 2.

9. A substrate holding apparatus comprising:
a substrate holder capable of holding a substrate;
a mask to be located on the substrate holder with the substrate interposed therebetween;
a first engaging portion which is formed on any one of the substrate holder and the mask and which has two protruding portions, wherein the two protruding portions of the first engaging portion are arranged along a first direction;

a second engaging portion which is formed on the any one of the substrate holder and the mask and which has two discrete protruding portions, wherein a length of a part that protrudes from the any one of the substrate holder and the mask, of the two discrete protruding portions of the second engaging portion, is shorter than each of a length of a part that protrudes from the any one of the substrate holder and the mask, of the two protruding portions of the first engaging portion, wherein the two discrete protruding portions of the second engaging portion are arranged along a second direction that is perpendicular to the first direction, the first and second directions being in a same plane;

first groove portions formed in the other one of the substrate holder and the mask to engage with the two protruding portions of the first engaging portion; and second groove portions formed in the other one of the substrate holder and the mask to engage with the two discrete protruding portions of the second engaging portion, wherein the two protruding portions of the first engaging portion have first tapered surfaces respectively formed at one end thereof, and the other ends of the two protruding portions of the first engaging portion are connected to any one of the substrate holder and the mask, the two discrete protruding portions of the second engaging portion have a second tapered surface formed at one end thereof, and the other ends of the two discrete protruding portions of the second engaging portion are connected to the any one of the substrate holder and the mask, and a region in which the two first tapered surfaces of the first engaging portion are formed and a region in which the second tapered surface of the second engaging portion is formed do not overlap with each other in a direction in which the substrate holder and the mask are engaged with each other.

10. The substrate holding apparatus according to claim 9, wherein each of the two protruding portions of the first engaging portion has a narrow portion formed on a side of the other end thereof.

11. The substrate holding apparatus according to claim 9, wherein the first groove portions are long openings that are long in respective directions toward a center of the other one of the mask and the substrate holder, and the second groove portions are long openings that are long in respective directions toward a center of the other one of the mask and the substrate holder.

12. The substrate holding apparatus according to claim 9, wherein the surfaces of the first engaging portion and the second engaging portion are coated with at least one of TiN and DLC.

13. The substrate holding apparatus according to claim 9, wherein the first engaging portion and the second engaging portion comprise an insulating ceramic.

14. A vacuum processing apparatus comprising:
a processing chamber for performing vacuum processing on a substrate in a vacuum atmosphere,
wherein the processing chamber is provided with the substrate holding apparatus according to claim 9.

* * * * *